United States Patent
Wang et al.

(10) Patent No.: US 8,547,131 B2
(45) Date of Patent: Oct. 1, 2013

(54) SYSTEM AND METHOD FOR OBSERVING THRESHOLD VOLTAGE VARIATIONS

(75) Inventors: Chung-Hsing Wang, Baoshan Township (TW); Chih-Chieh Chen, Launtang Taoyuan (TW); Yi-Wei Chen, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 903 days.

(21) Appl. No.: 12/688,025

(22) Filed: Jan. 15, 2010

(65) Prior Publication Data

US 2010/0253382 A1 Oct. 7, 2010

Related U.S. Application Data

(60) Provisional application No. 61/166,602, filed on Apr. 3, 2009.

(51) Int. Cl.
*G01R 31/02* (2006.01)
(52) U.S. Cl.
USPC ............. 324/762.09; 324/762.01; 324/713; 324/705; 327/285
(58) Field of Classification Search
USPC .................................. 327/266; 324/762.09
See application file for complete search history.

(56) References Cited

U.S. PATENT DOCUMENTS

| | | | |
|---|---|---|---|
| 4,164,666 A | 8/1979 | Hirasawa | |
| 4,494,021 A | 1/1985 | Bell et al. | |
| 5,227,675 A * | 7/1993 | Taguchi | 327/530 |
| 5,365,204 A | 11/1994 | Angiulli et al. | |
| 5,461,591 A * | 10/1995 | Kim et al. | 365/226 |
| 6,724,268 B2 | 4/2004 | Takahashi | |
| 6,774,734 B2 | 8/2004 | Christensen et al. | |
| 6,958,659 B2 | 10/2005 | Nakajima | |
| 7,069,525 B2 | 6/2006 | Bhushan et al. | |
| 7,205,854 B2 | 4/2007 | Liu | |
| 7,323,908 B2 * | 1/2008 | Chuang et al. | 326/83 |
| 7,675,372 B2 | 3/2010 | Bang et al. | |
| 8,229,683 B2 * | 7/2012 | Gebara et al. | 702/42 |
| 2003/0141847 A1 * | 7/2003 | Fujiwara | 320/134 |
| 2005/0140418 A1 * | 6/2005 | Muniandy et al. | 327/291 |
| 2008/0195337 A1 * | 8/2008 | Agarwal et al. | 702/75 |
| 2009/0189703 A1 * | 7/2009 | Chuang et al. | 331/57 |
| 2010/0176890 A1 | 7/2010 | Chen et al. | |

OTHER PUBLICATIONS

Bhushan, M., et al., "Ring Oscillator Based Technique for Measuring Variability Statistics," Microelectronic Test Structures, 2006, IEEE International Conference, pp. 87-92.

* cited by examiner

*Primary Examiner* — Richard Isla Rodas
(74) *Attorney, Agent, or Firm* — Slater & Matsil, L.L.P.

(57) ABSTRACT

A system and method for observing threshold voltage variations are provided. A ring oscillator circuit comprises a plurality of inverters arranged in a sequential loop, a plurality of test circuits having devices under test, each coupled between a respective one of the inverters and a power supply. Each test circuit has a bypass field effect transistor (FET) having a first channel coupled between the power supply and a respective one of the inverters responsive to an individual enable signal, and a FET device under test having a second channel arranged in parallel to the first channel. A method is described for determining the threshold voltage of the device under test by disabling, for one of the inverters in the ring oscillator, the first FET device such that the device under test is coupled between the power supply and the respective inverter and affects the operating frequency of the ring oscillator.

14 Claims, 11 Drawing Sheets

| Turn off All DUTs | |
|---|---|
| Average frequency | 330.23 |
| Max frequency | 333.95 |
| Min frequency | 326.54 |
| Frequency STD | 1.16 |
| STD/Average | 0.35% |

Fig. 12a

| Turn on one NDUT | |
|---|---|
| Correlation coefficient | -0.950 |
| Average frequency | 172.43 |
| Max frequency | 216.21 |
| Min frequency | 121.26 |
| Frequency STD | 15.54 |
| STD/Average | 9.02% |

Fig. 12b

| Turn on one PDUT | |
|---|---|
| Correlation coefficient | -0.946 |
| Average frequency | 169.21 |
| Max frequency | 212.48 |
| Min frequency | 83.71 |
| Frequency STD | 17.89 |
| STD/Average | 10.57% |

Fig. 12c

SYSTEM AND METHOD FOR OBSERVING THRESHOLD VOLTAGE VARIATIONS

This application claims the benefit of U.S. Provisional Application No. 61/166,602, entitles "System and Method for Observing Threshold Voltage Variations," files on Apr. 3, 2009, which is incorporated herein by reference.

TECHNICAL FIELD

The present invention relates generally to semiconductor devices, and more particularly to a system and method for observing threshold voltage variations.

BACKGROUND

Semiconductors are used in integrated circuits for a wide range of applications, including personal computers, music and/or video devices, multimedia devices, digital assistants, communications devices, and so forth. In general, integrated circuits manufactured using modern semiconductor fabrication processes may be extremely consistent, with individual integrated circuits from a single wafer being substantially identical to one another in terms of performance.

However, process variations may occur. Process variations may include field effect transistor channel widths and lengths, gate oxide thicknesses, doped material concentrations, and so forth. A fairly common side-effect due to variations in the fabrication process used to create integrated circuits may be local changes in threshold voltage ($\Delta V_{TH}$) of transistors in the integrated circuits. A change in threshold voltage may alter leakage current, which may impact dynamic random access memory (DRAM) charge retention times, transistor operating speeds, logic gate switching speeds, and so forth.

FIG. 1a is a diagram of a prior art ring oscillator 100 as typically used to characterize process variations in an integrated circuit. Ring oscillator 100 comprises an odd number of inverters 105-109 arranged serially in a loop. When an integrated circuit containing ring oscillator 100 is powered on, ring oscillator 100 will also be energized and will automatically produce a clock signal at a frequency that is a function of inverters 105-109. The frequency of the clock signal may be measured to determine global process variations. For example, if the frequency of the clock signal is greater than an expected frequency, then the threshold voltage of at least one of the inverters may have decreased below an expected value. Similarly, if the frequency of the clock signal is lower than the expected frequency, then the threshold voltage of at least one of the inverters may have increased beyond the expected value.

FIG. 1b is a diagram of a prior art single stage of a prior art ring oscillator 150. Rather than having only inverters arranged serially in a loop, each stage of ring oscillator 150 comprises an inverter 155 and also a pass gate 160. Each stage also includes an effective load 165 modeled as a capacitor. Effective load 165 may be representative of a subsequent stage coupled to pass gate 160. Pass gate 160 may be used to make or break the loop. Pass gate 160 may be implemented using a field effect transistor (FET), such as an NFET or a PFET. Preferably, each stage of ring oscillator 150 includes a pass gate formed from the same type of FET. The use of a particular type of FET may allow for a characterization of process variations for that particular type of FET. For example, if NFETs are used to implement pass gate 160, then it may be possible to determine global process variations for NFETs. Similarly, if PFETs are used, then it may be possible to determine global process variations for PFETs. By adding the pass gate transistors to the ring and observing the frequency of the ring oscillator, an average value for transistor threshold voltage variations in the particular integrated circuit device may be obtained. By implementing multiple oscillators, some having PFETs and some having NFETs, the average value for a variation in the threshold voltage for P and N FET devices may be obtained.

FIG. 2 is a diagram of an integrated circuit 200. Integrated circuit 200 includes integrated circuitry 205 that implements the functionality of integrated circuit 200. Integrated circuit 200 also includes several ring oscillators such as, for example, the ring oscillator 210 arranged along a top side of integrated circuit 200, ring oscillators 215-216 arranged along left and right edges of integrated circuit 200, ring oscillator 220 arranged on a lower right hand corner of integrated circuit 200, ring oscillator 225 formed in an interior of integrated circuit 200, and so forth. A ring oscillator may also be formed along more than one edge of integrated circuit 200. On a semiconductor wafer, many integrated circuits are fabricated at the same time, prior to being separated and packaged as integrated circuits. Ring oscillators may be provided as test structures at certain places on the wafer, or in the scribe line areas, and tested using wafer probes to determine whether the threshold voltages for devices in different areas of the semiconductor wafer fall within acceptable ranges, for example. Using the ring oscillators may allow for a measurement of process variations throughout integrated circuit 200. In general, it is desirable to have multiple ring oscillators or alternatively to have a large ring oscillator distributed over different portions of integrated circuit 200, so that the elements of the ring oscillators may encounter process variations like the circuitry in integrated circuit 200. FIG. 2 may illustrate an exaggerated use of ring oscillators in an integrated circuit.

The approaches of the prior art to characterizing the transistor threshold voltage variations have several disadvantages. The measurements of ring oscillator frequency may not correlate highly to the threshold voltage variations, making the measurements less reliable than desired. In the prior art, the measurements are often indicative of only an average threshold variation in the particular oscillator. Local variations within the ring oscillator may not be detectable. A continuing need thus exists for methods and circuitry to provide highly correlated measurements of threshold voltage variations, and to provide the ability to measure local variations in transistor threshold voltages on an integrated circuit or semiconductor wafer in a cost effective manner.

SUMMARY OF THE INVENTION

These and other problems are generally solved or circumvented, and technical advantages are generally achieved, by embodiments of a system and a method for characterizing process variations.

In accordance with an embodiment, a method for measuring threshold voltage variations is provided, comprising providing a ring oscillator comprising a plurality of inverter circuits coupled in series, each inverter supplied with a virtual positive supply voltage and a virtual ground supply voltage; providing an NFET device under test corresponding to each of the inverters coupled between a positive voltage supply and the respective virtual voltage supply responsive to an individual enable signal; and characterizing the threshold voltage variations of the NFET devices of a process by observing the frequency of the ring oscillator when no devices under test are enabled, and further observing the frequency of the ring oscillator when one of the NFET devices is enabled.

Further method embodiments and alternative circuit and system embodiments are provided to advantageously enable the observation of device threshold variations in an integrated circuit or wafer by virtue of making simple frequency measurements while enabling individual devices under test within the ring oscillator and the threshold voltages of the devices under test correlating to the observed oscillator frequencies.

In accordance with another embodiment, a circuit is provided comprising a plurality of inverters arranged in a sequential loop; and a plurality of test circuits, with each test circuit coupled between a device power supply and a respective power supply node to a respective one of the inverters, each test circuit comprising a first field effect transistor (FET) having a first channel coupled between the reference power supply and receiving an enable signal on a gate terminal of the first FET, and a second FET having a second channel coupled in parallel to the first channel and having a gate terminal coupled to the power supply; wherein when the first FET is disabled by the enable signal, the voltage at the power supply node to the inverter is changed due to the threshold voltage of the second FET.

In accordance with another embodiment, an integrated circuit is provided, comprising integrated circuitry disposed on a substrate, the integrated circuitry configured to perform defined operations; and at least one ring oscillator disposed on the substrate, the ring oscillator configured to produce a clock signal at a frequency dependent on a configuration of elements in the ring oscillator, the ring oscillator comprising a plurality of inverters serially arranged in a loop, each receiving a virtual positive voltage supply and a virtual ground voltage supply; a plurality of header test circuits corresponding to one of the plurality of inverters, each comprising a bypass transistor receiving an enable signal on a gate terminal and having a channel coupled between a positive voltage supply and the respective virtual voltage supply and each further comprising a header transistor under test having a channel coupled between the positive voltage and the respective virtual voltage supply. A plurality of footer test circuits are also provided, each corresponding to one of the plurality of inverters, each also comprising a bypass transistor receiving an enable signal on a gate terminal and having a channel coupled between a ground voltage supply and the respective virtual ground voltage supply, and each further comprising a footer transistor under test having a channel coupled between the ground voltage supply and the respective virtual ground voltage supply; wherein the frequency of oscillation of the ring oscillator may be affected by one of a header transistor under test and a footer transistor under test, responsive to the respective bypass transistor being disabled by the corresponding one of the enable signals.

An advantage of an embodiment is that localized process variations may be quantified, permitting a greater degree of accuracy in locating process variations than in the prior art. High correlation between the observed frequency of the oscillator and the threshold voltages for both the P and N type devices under test enable reliable characterizations with simple measurements.

A further advantage of an embodiment is that localized and global process variations for both NFET and PFET transistors may be determined using a single ring oscillator. This may simplify implementation as well as reduce integrated circuit real estate used in process variation determination.

Yet another advantage of an embodiment is that the ring oscillator produces a digital output, enabling easy measurement and processing.

The foregoing has outlined rather broadly the features and technical advantages of the present invention in order that the detailed description of the embodiments that follow may be better understood. Additional features and advantages of the embodiments will be described hereinafter which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the embodiments, and the advantages thereof, reference is now made to the following descriptions taken in conjunction with the accompanying drawings, in which:

FIG. 4b is a diagram of an equivalent circuit of the ring oscillator in FIG. 4a;

FIG. 12a is a table presenting simulation results for an oscillator embodiment implemented using the embodiments of the present invention in a normal mode; FIG. 12b is a table presenting simulation results for the oscillator embodiment when testing NMOS device threshold voltage variations; and FIG. 12c is a table presenting simulation results for the oscillator embodiments of the present invention for PMOS threshold voltage variations.

DETAILED DESCRIPTION

The making and using of the embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The embodiments will be described in a specific context, namely an integrated circuit for use in an electronic device, wherein there is a desire to measure fabrication process variations.

In a related co-owned pending application entitled "System and Method for Characterizing Process Variations", filed as a provisional U.S. Patent Application on Jan. 14, 2009, Ser. No. 61/144,672, which application is hereby incorporated by reference herein in its entirety, circuitry and methods for providing an improved ring oscillator arrangement for observing local threshold voltage in MOS devices are presented. The embodiments of the present invention extend the concepts in the above referenced application, and provide alternative embodiments and improvements over the embodiments of the prior application.

Figure 1A:
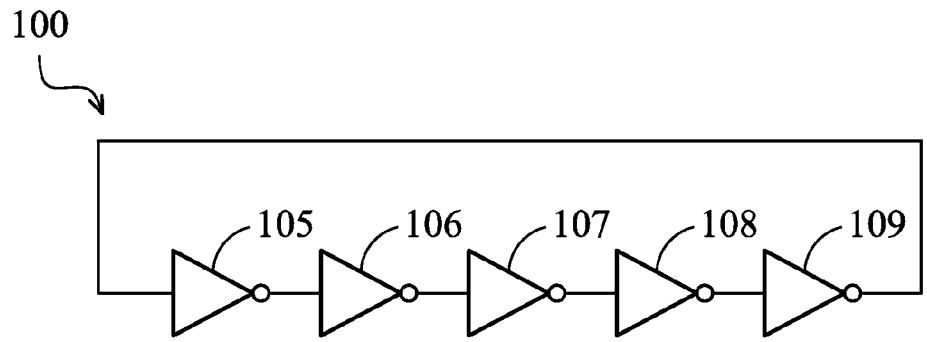
FIG. 1a is a diagram of a prior art ring oscillator.
Figure 1B:
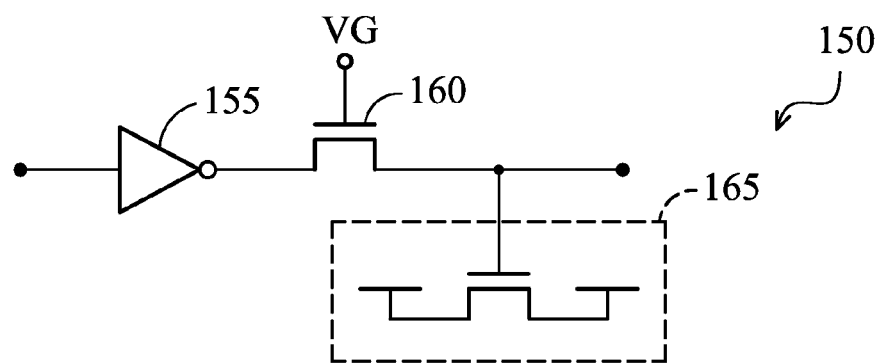
FIG. 1b is a diagram of a single stage of a prior art ring oscillator.
Figure 2:
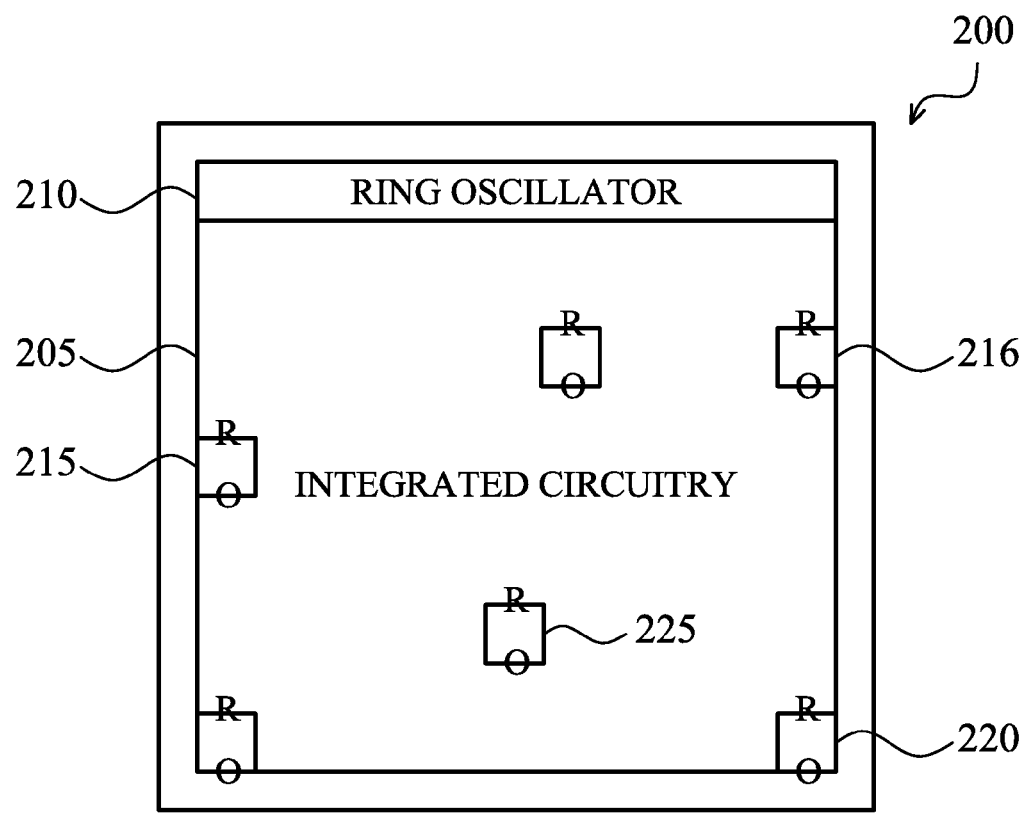
FIG. 2 is a diagram of an integrated circuit including a number of ring oscillators.
Figure 3A:
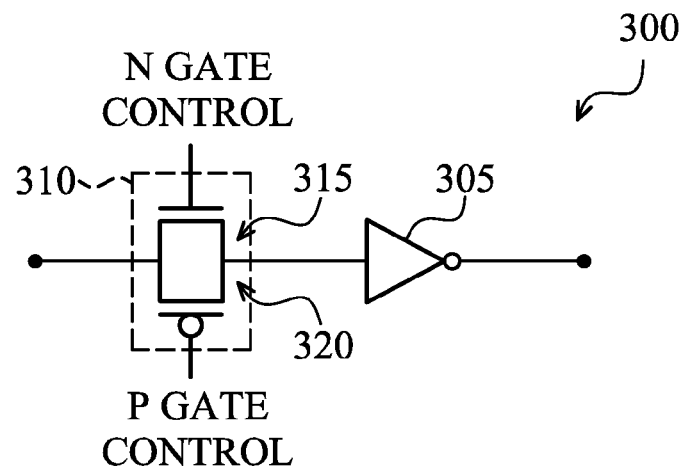
FIG. 3a is a diagram of a single stage of another ring oscillator.

FIG. 3a is a diagram of a single stage 300 of a ring oscillator embodiment of the prior application. Stage 300 includes an inverter 305 and a transmission gate 310 coupled to an input of inverter 305. Transmission gate 310 includes an NFET 315 and a PFET 320 with their channels arranged in a parallel, and their drain terminals coupled together and their source terminals coupled together. A gate terminal of NFET 315 may be coupled to an "N GATE CONTROL" control signal and a gate terminal of PFET 320 may be coupled to a "P GATE CONTROL" control signal.

According to an embodiment provided in the prior application, the "N GATE CONTROL" and "P GATE CONTROL" control signals may be independent signals, enabling NFET 315 and PFET 320 to be turned on or off independently. When either NFET 315 or PFET 320 or both are turned on (N GATE CONTROL=1 for NFET 315 and P GATE CONTROL=0 for PFET 320), a signal at input of inverter 305 may propagate to inverter 305, while when both NFET 315 and PFET 320 are turned off, the signal at input of inverter 305 may not propagate to inverter 305.

Figure 3B:
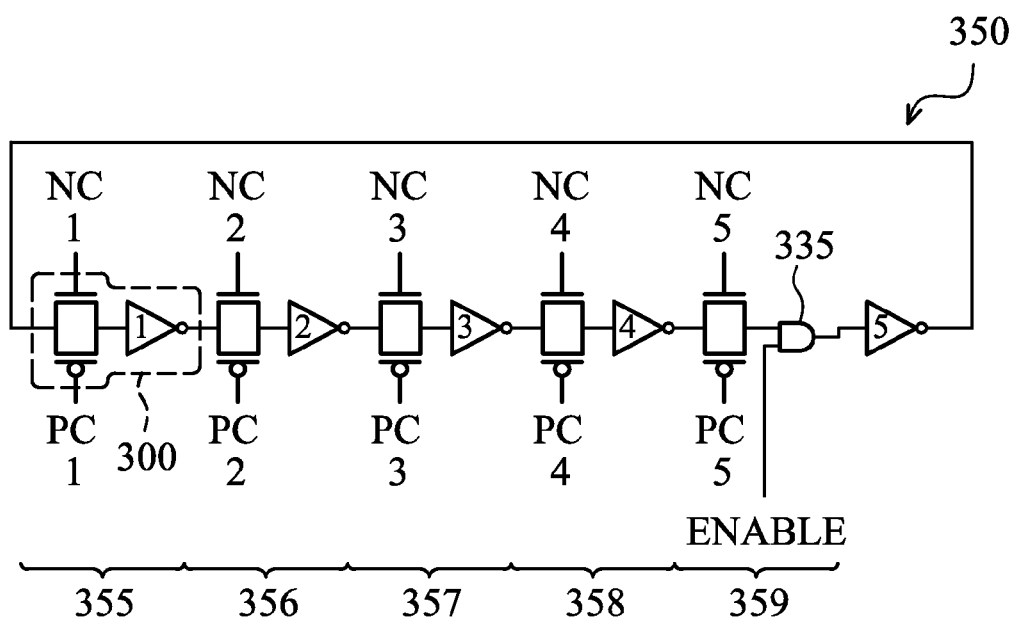
FIG. 3b is a diagram of a ring oscillator.

FIG. 3b is a diagram of a ring oscillator 350 formed from an odd number of stages 300. A ring oscillator is provided comprising an odd number of stages arranged serially in a loop. As shown in FIG. 3b, ring oscillator 350 includes five stages 355-359. Each stage 355-359 may have as input independent "N GATE CONTROL" and "P GATE CONTROL" control signals, for example, stage 355 may have as input "N GATE CONTROL (NC 1)" and "P GATE CONTROL (PC 1)" control signals. As discussed previously, the use of independent control signals may allow for the individual control of transistors in each pass gate in ring oscillator 350.

Ring oscillator 350 further includes an enable input that may be used to turn ring oscillator 350 on or off. As shown in FIG. 3b, the enable function may be implemented as an AND gate 335 and an ENABLE control signal. AND gate 335 may have the ENABLE control signal as a first input and, depending on location of AND gate 335, an output of one of the transmission gates or an inverter in the loop as a second input.

Although shown in FIG. 3b as being a part of stage 359, AND gate 335 may also be placed in between adjacent inverter stages. Although ring oscillator 350 is shown with a transmission gate in each stage, alternative embodiments may have fewer transmission gates than inverter stages. The smaller number of transmission gates may simplify the characterizing of process variations while providing some degree of localized characterizing of process variations. Furthermore, the smaller number of transmission gates may help to reduce the size and complexity of the ring oscillators. However, the use of additional transistor gates will add more local observability and improve the information obtained.

Figure 4A:
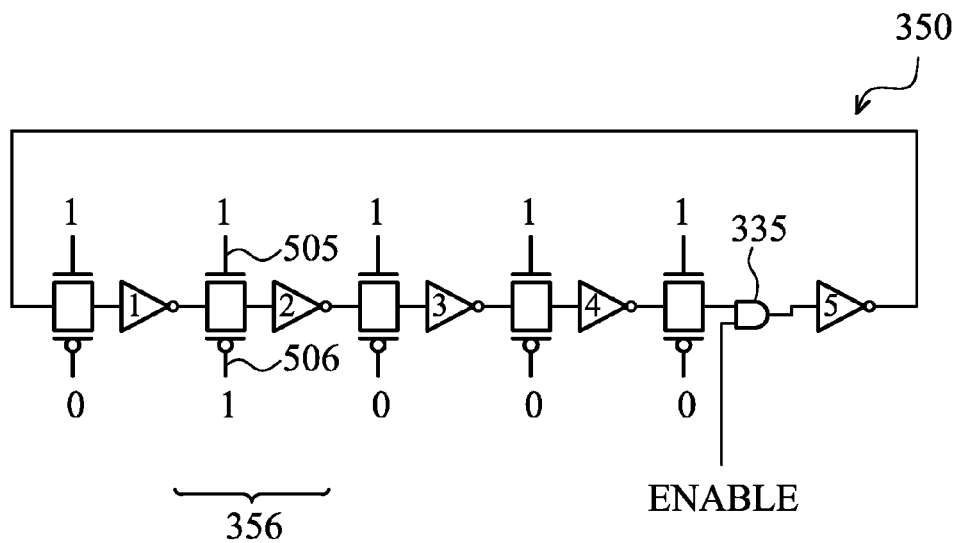
FIG. 4a is a diagram of a ring oscillator with specific control signals applied to transistors in transmission gates in the ring oscillator.

FIG. 4a is a diagram illustrating ring oscillator 350 in a threshold voltage monitoring operation. As shown in FIG. 4a, all of the "N GATE CONTROL" control signals are set to one (1) and all of the "P GATE CONTROL" control signals, with the exception of the "P GATE CONTROL" control signal for stage 356 being set to one (1), are set to zero (0). This configuration results in both the NFET and the PFET in each transmission gates (except for the transmission gate in stage 356) being turned on and effectively disappearing from the operation of ring oscillator 350.

Figure 4B:
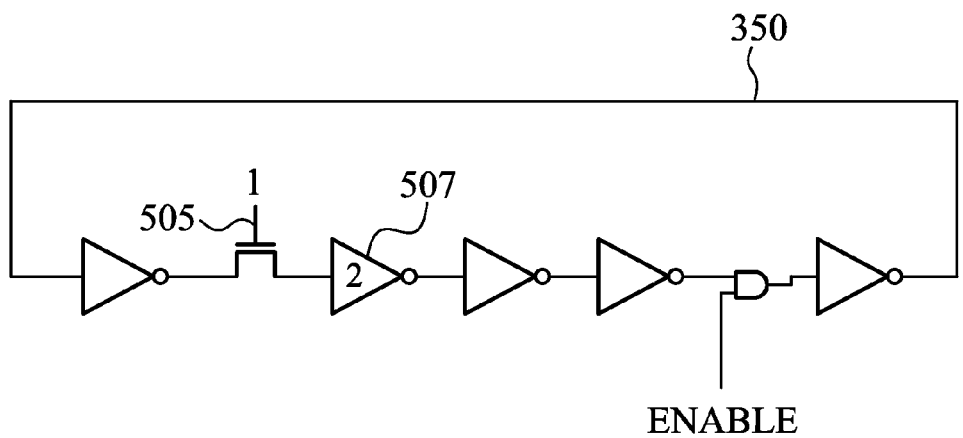

The transmission gate in stage 356 may have its NFET 505 turned "on" and its PFET 506 turned "off". With PFET 506 turned off, NFET 505 remains in the circuit for ring oscillator 350. FIG. 4b is a diagram illustrating an equivalent circuit for ring oscillator 350 as configured in FIG. 4a. Since NFET 505 remains in the ring oscillator 350, it may have an impact on the frequency of ring oscillator 350. That is, NFET 505 is now configured as a "device under test" (DUT) and the frequency measurement taken in this configuration will provide a measurement of the threshold voltage variation of the NFET 505. The remaining NFET and PFET devices are effectively not in the measurement. Thus, a local threshold voltage variation measurement may be provided by this embodiment from the prior application. Measuring the ring oscillator frequency with, and without, the NFET 505 in the circuit provides an observation corresponding to the threshold voltage. By comparing the threshold voltage of different DUTs in different parts of the oscillator one at a time, threshold voltage variation measurements may be obtained by observing simple frequency measurements.

Figure 5:
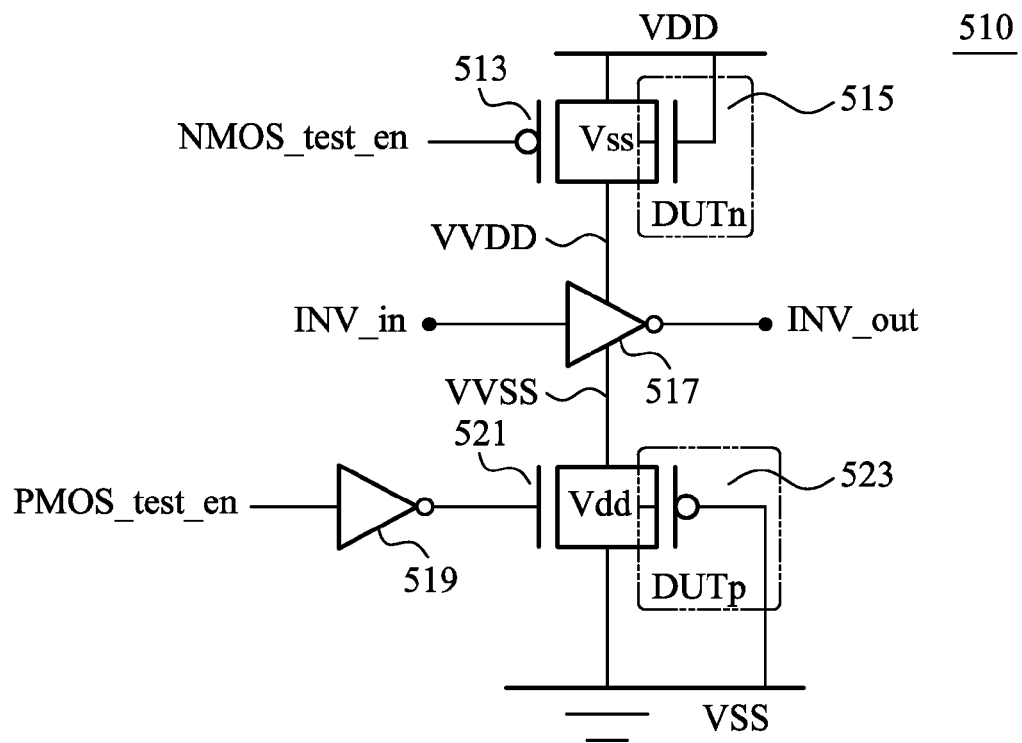
FIG. 5 is a diagram of an embodiment of a single stage for a ring oscillator of the present invention.

FIG. 5 depicts in a circuit diagram one exemplary embodiment of an improved ring oscillator stage 510 of the present invention. In FIG. 5, the inverter stage 517 receives as an input from the previous stage a signal INV_in and drives an output INV_out to the next stage. A "header" circuit comprises a bypass gate implemented as a PMOS transistor 513, and receiving an input enable signal NMOS_test_en, NMOS transistor 515, which is available as an NMOS device under test (DUTn), and the header circuit outputs a virtual supply voltage to the inverter stage 517, labeled VVDD. The supply voltage V DD remains constant.

Similarly, a "footer" circuit is provided that includes a PMOS "DUT" 523, a bypass gate 521 which receives an enable signal PMOS_test_en as an input, and which supplies a virtual ground supply labeled VVSS to inverter 519. PMOS device under test (DUTp) 523 is coupled between the VVSS node and the ground or lower power supply VSS.

By turning on the PMOS transistor 513, the voltage VVDD can rise almost all the way to the VDD supply (the positive "rail") as is known in the art, because the PMOS transistor 513 will continue to conduct so long as the gate input signal NMOS_test_en is lower than VDD by an amount greater than a threshold voltage. The resistance Rdson of the PMOS gate 513 is small so that the voltage difference between VDD and VVDD is likewise minimized. Similarly, by using the NMOS transistor 521 to couple the virtual supply VVSS node to the VSS voltage, the VVSS voltage can fall almost all the way to VSS, as the NMOS transistor 521 will continue to conduct so long as the gate input voltage is at least a threshold voltage above VSS, as provided by inverter 519. Thus, when the test circuits DUTn and DUTp are bypassed, they are essentially out of the circuit. Further, by making the bypass gate transistors larger than the DUT transistors, additional current is available to the load, effectively the header and footer circuits are "out of the circuit" when the test_en input signals are in an "inactive" state, as VVDD approaches VDD for all of the stages and VVSS approaches VSS for all of the stages in the oscillator. The sizes of the transistors 513 and 521, may be controlled to ensure that the virtual voltages approach the VDD and VSS voltages when the test devices 515 and 523 are out of the circuit.

Note that although the embodiment of FIG. 5 depicts a ring oscillator stage embodiment whereby, in a single stage, both NMOS and PMOS threshold voltage variations may be observed by individually placing the respective device under test (DUTn 515 or DUTp 523, depending on the configuration) in the circuit, alternative embodiments of the present invention include forming an inverter stage embodiment with only a "header" portion to test the NMOS voltage threshold variation, and elsewhere forming an inverter stage embodiment with only a "footer" portion to test the PMOS voltage threshold variation. Ring oscillators having only NMOS DUT devices or PMOS DUT devices could then be formed and used for separate measurements of the P and N MOS voltage threshold variations. These alternative embodiments, although less efficient in terms of silicon area, are also envisioned as additional embodiments of the present invention and fall within the scope of the appended claims.

Figure 6:
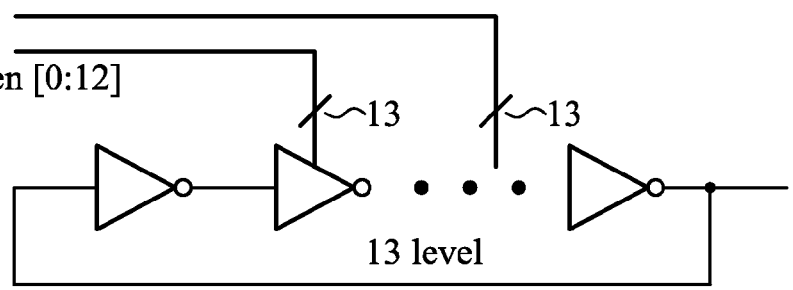
FIG. 6 is a diagram of a 13 stage ring oscillator with specific control signals applied to each stage in the ring oscillator.

FIG. 6 is a diagram illustrating a 13 stage ring oscillator using the embodiments of the invention. In FIG. 6, the test control signals are shown as a PMOS_test_en and an NMOS_test_en group of signals, one bit of the respective signal group is directed to each inverter stage. Thus, by putting a "0" on all of the test enable signals, none of the DUTn or DUTp devices is in the circuit and the ring oscillator will operate at its natural frequency.

However, in a testing scenario, by placing a "0" in one of the test enable signals, for either a DUTn or a DUTp in one of the stages, the embodiment can test one of the P or N DUTs by putting them into the circuit. Further, each stage of the oscillator may be individually selected, and P and N devices may be individually tested to monitor local threshold voltage variations in the MOS devices.

Figure 7A:
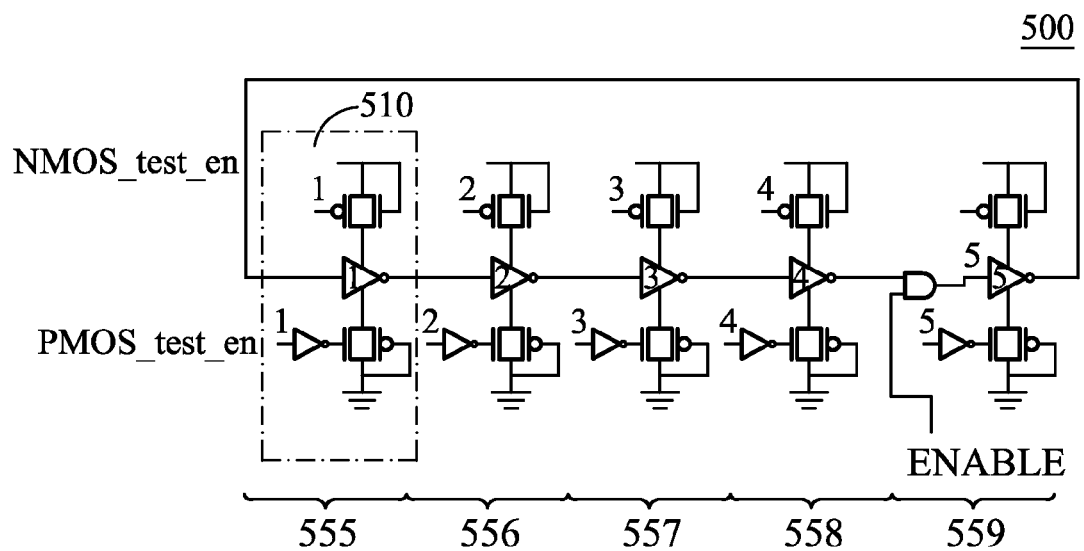
FIG. 7a is a diagram of a ring oscillator embodiment formed using the single stage embodiment of FIG. 5.

FIG. 7a depicts in a circuit diagram the implementation of a five stage ring oscillator 500 using the embodiment inverter stage circuit 510 of FIG. 5 for each of the five stages 555-559, and labeled 1-5. Each of the header circuits will receive a respective bit from the group of NMOS_test_en signals, and each of the footer circuits will receive a respective bit from the group of PMOS_test_en signals. The stages, 555, 556, 557, 558 and 559 are coupled in a ring or loop, with the output of one stage forming the input of the next, and an ENABLE signal will enable the ring oscillator to run, or not by the action of an AND gate 511.

Figure 7B:
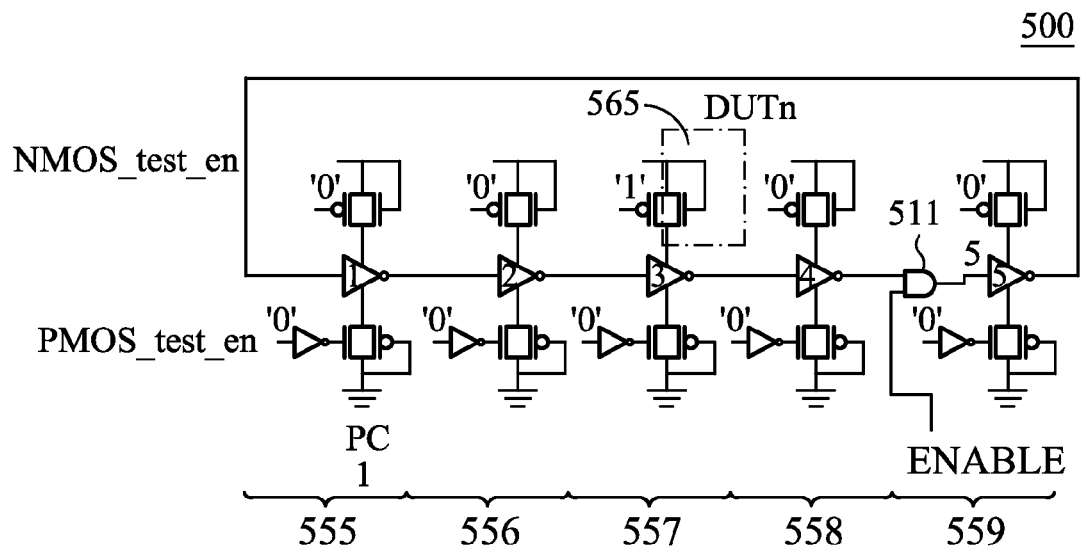
FIG. 7b is a diagram of the ring oscillator of FIG. 7a configured in a test mode configuration.

FIG. 7b depicts the ring oscillator 500 in an example test operation. In this example, all of the NMOS_test_en control signals are set to zero and all of the PMOS_test_en control signals are also set to zero, with the exception of the NMOS_test_en control signal for stage 557 being set to one (1). This configuration results in the NMOS FET 565 being in the circuit as the DUT, and this DUTn device will be "in the circuit" forming the ring oscillator. The remaining stages are all configured to bypass the test devices DUTn and DUTp in each stage.

Note that the DUTp in the footer portion of stage 557 is still bypassed and is not in the oscillator circuit. The frequency of the oscillator may now be affected by the device DUTn therefore, the frequency measurement provides a measurement correlating to the threshold voltage of NMOS FET 565. Each DUTn and DUTp device may be placed individually in the circuit by varying the PMOS_test_en and NMOS_test_en signals. In each test configuration, for the respective one of the stages, the DUTn or DUTp is placed in the circuit and the frequency of the ring oscillator observed then provides a measurement correlating to the threshold voltage of that particular device. By comparing the threshold voltages against an expected threshold or against other measurements, threshold voltage variation can be determined. Local variations can be determined for any particular stage. Process characterization for a device, group of devices, or for a wafer may be quickly performed by simple frequency measurements.

Figure 7C:
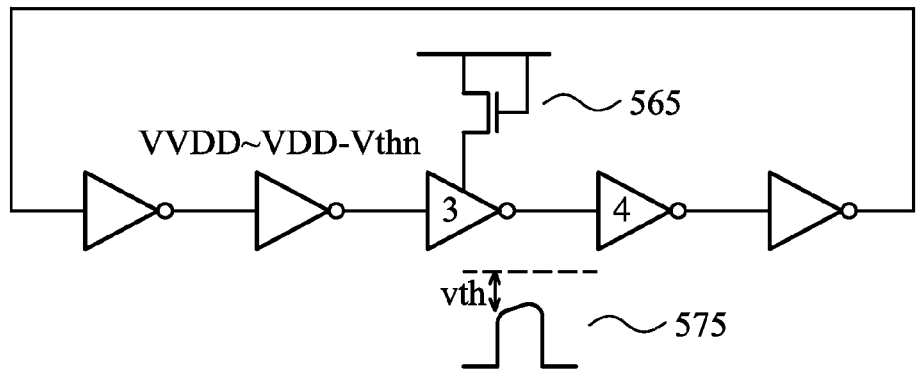
FIG. 7c is a diagram of an equivalent circuit of the ring oscillator in the test mode of FIG. 7b.

FIG. 7c is a diagram illustrating the equivalent circuit of the ring oscillator 500 as configured in FIG. 7b. NMOS FET 565 is shown in the circuit for the stage '3' inverter, the remaining stages have the test devices bypassed and so these DUTs are not in the circuit. The voltage VVDD at the supply input to inverter 3 is now lowered by the threshold voltage Vthn of the NMOS FET 565, that is VVDD is approximately VDD-Vthn. Also, the presence of the device 565 affects the input voltage of the next stage 4, as the output of the stage 3 inverter is also lowered by the threshold voltage Vtn. The frequency of operation of the oscillator is therefore affected. Measuring the frequency of the oscillator provides a correlating measurement of the Vtn threshold voltage of NMOS FET 565. Note that unlike the prior art ring oscillators, this frequency measurement corresponds to the threshold voltage contribution of a single DUT and is not an "average", so that local device threshold variations may be observed from simple frequency measurements. Faster and slower devices may appear in different portions of a device or wafer and this information is important in determining the causes of process variation, for example.

Pulse 575 represents a pulse provided as an output of stage 3 to stage 4. Pulse 575 may be reduced, due to the fact DUT 565, an NMOS FET, is in the circuit, by an amount substantially equal to the threshold voltage of NFET 565 (VTHN). If the VTHN is large, then pulse 575 may be significantly lower at its peak than VDD (the normal level), while if VTHN is small, then pulse 575 may be about equal to VDD. Therefore, if pulse 575 is small, then the output of inverter stage 4 may be slowed due to the small voltage potential (and correspondingly small current) of the input pulse 575, thereby further impacting the frequency of ring oscillator 500. The frequency of ring oscillator 500 may then be measured and used to determine threshold voltage variations present in NFET 565 (if any).

The above discussion focuses on turning on and off various bypass gates in the "header" circuits between VDD and the VDD supply VVDD to inverters in the ring oscillator. These configurations are used in order to obtain measurements corresponding to localized process variations for NFETs. In a similar technique, various bypass gates in the footer circuits may be turned on and off to obtain localized process variation measurements for the DUTp PFETs for the inverter stages of the oscillator. Therefore, the discussion of the characterization of localized process variations for NFETs should not be construed as being limiting to either the scope or the spirit of the embodiments. The embodiments easily allow for measuring the local threshold voltage variations in the PFETs as well, again by using simple oscillator frequency measurements.

Figure 8:
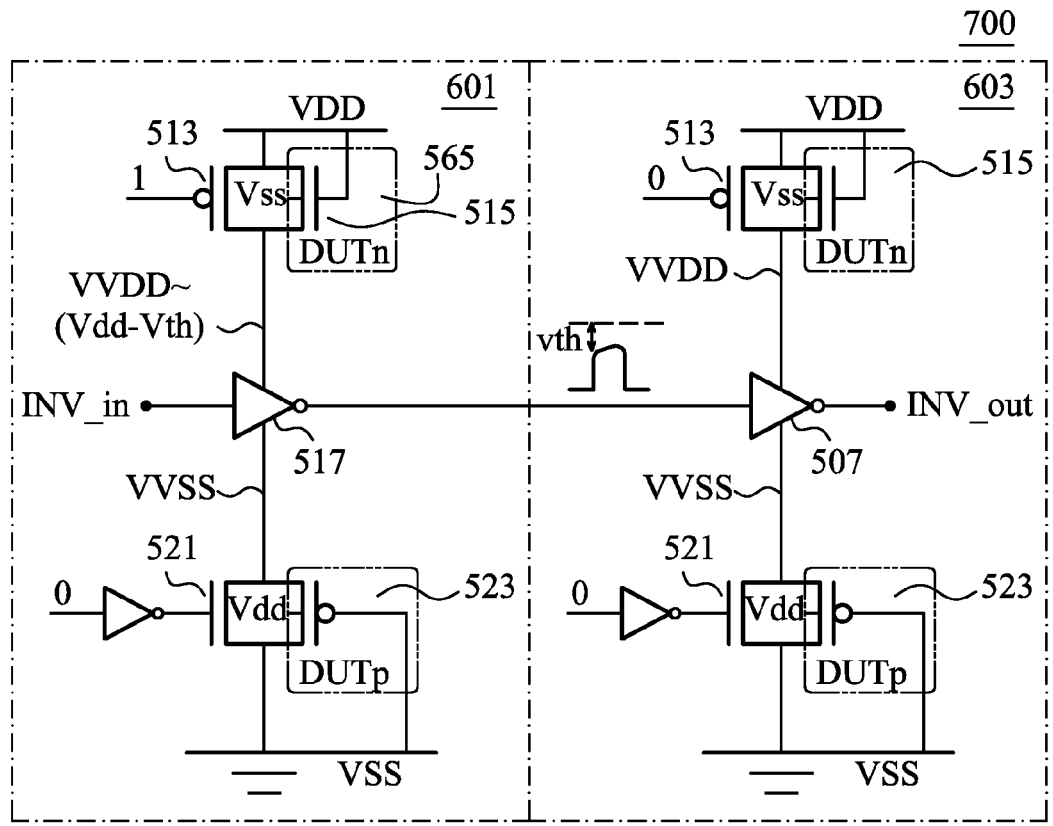
FIG. 8 is a circuit diagram of two stages of a portion of a ring oscillator embodiment configured in a test mode.

In order to further illustrate the effect of adding a DUT to the ring oscillator on operation of the oscillator, FIG. 8 is a circuit diagram illustrating a two stage portion of a ring oscillator 700. Stage 601 and stage 603 of ring oscillator 700 are shown. Each stage 601 and 603 includes an inverter 517 and a header circuit comprised of a bypass PMOS gate 513 receiving a control input from the NMOS_test_en signals, an NMOS test device 515, the header circuits providing a virtual supply voltage VVDD to the inverters 517 for each stage. Each stage 601 and 603 also includes a footer circuit comprised of an NMOS bypass gate 521 receiving a control signal and a PMOS device under test 523. For discussion purposes, NMOS transistor 565, in stage 601 is referred to as DUTn.

As shown in FIG. 8, DUTn 565 is "in the circuit" of the ring oscillator 700 because the PMOS transistor 513 is turned off by the '1' signal on its gate, meaning the respective signal from NMOS_test_en at stage 601 is active. The remaining bypass gates of stage 601 and stage 603 are all turned on, so the remaining devices under test are not in the circuit. The virtual supply voltage coupled to inverter 517 in stage 601 is therefore reduced by the threshold voltage Vthn of the test device, DUTn 565. Again, the pulse at the input of the stage 603 is shown with a magnitude reduced by the threshold voltage of DUTn device 565.

The frequency of the oscillator is therefore affected both by the reduced VDD supply to the inverter of stage 601, which will affect the switching speed of the inverter 517 in stage 601, and the reduction in magnitude of the output pulse, which is input to stage 603.

Figure 9:
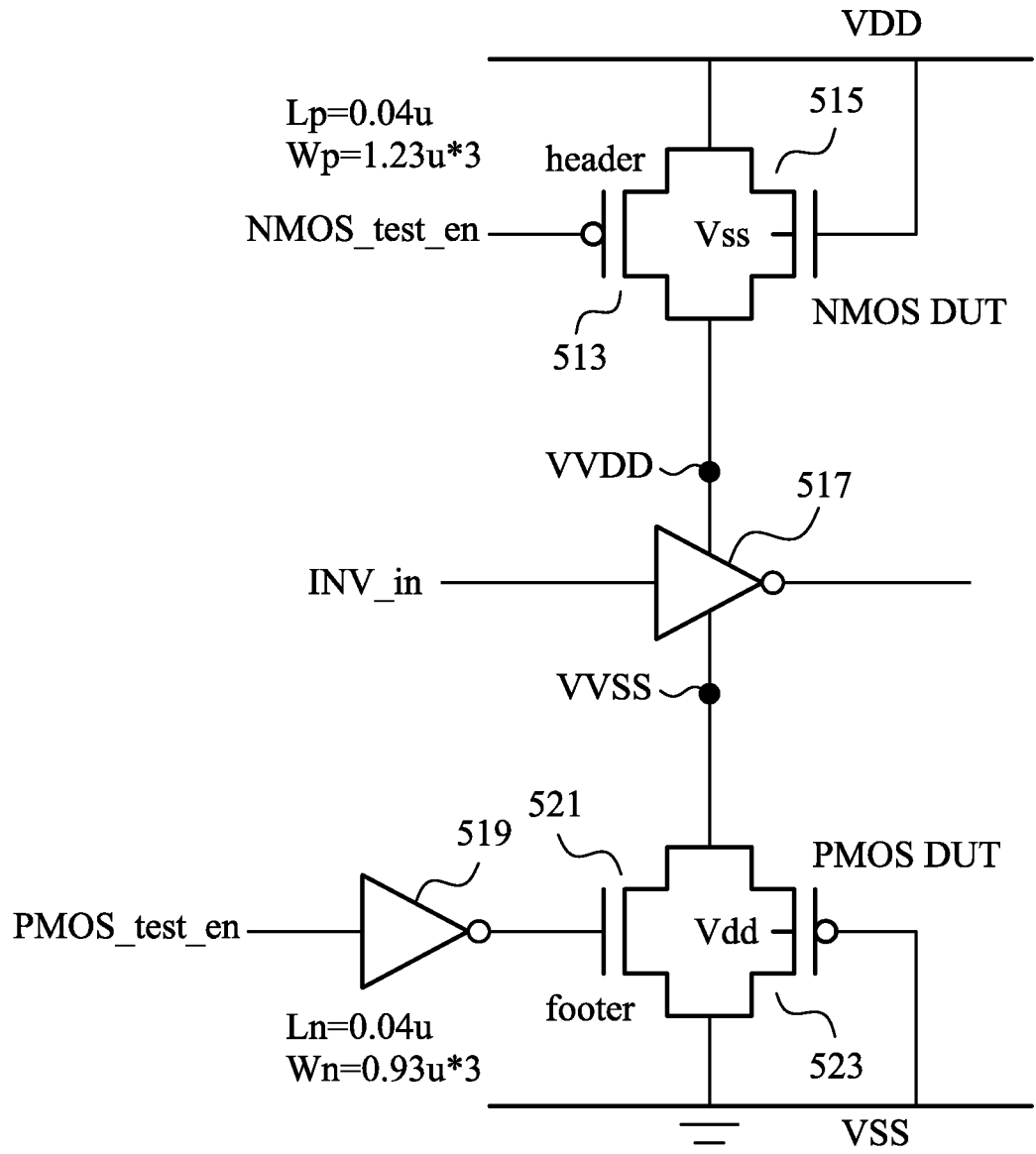
FIG. 9 is another diagram of the single stage embodiment of FIG. 6, with exemplary simulation parameters shown.

FIG. 9 depicts a representative embodiment inverter stage implemented in a current semiconductor process, for example a 65 nanometer CMOS process, or smaller. The length and width ratios of the bypass transistor devices are shown, with Lp for the PMOS bypass gate 513 being 0.04 um, and Wp being 1.23 um, while for the NMOS bypass gate of the footer circuit, the length Ln was 0.04 um while the width Wn was 0.93 um. The inverters 517 each comprise, as is known to those skilled in the art, a PMOS pull up and an NMOS pull down transistor, in this illustrative example implementation, the sizes of those devices was Lp=0.2 um, Wp=1.23 um. Ln=0.2 um Wn=0.93 um.

Figure 10A:
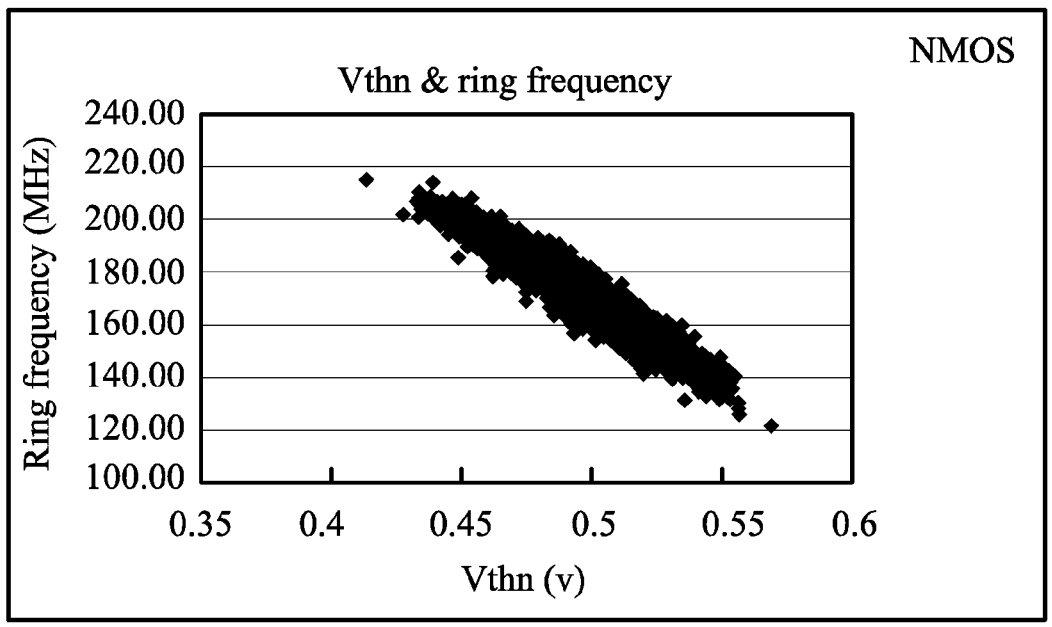
FIG. 10a depicts simulation results for NMOS threshold voltages obtained using the elements and parameters of FIG. 9.
Figure 10B:
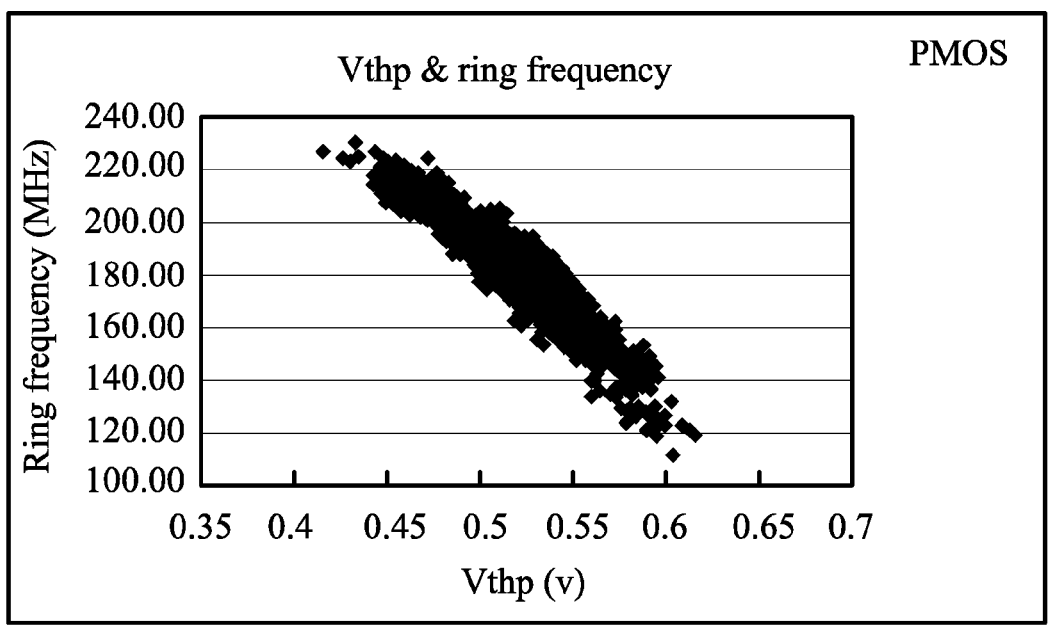
FIG. 10b depicts simulation results for PMOS threshold voltages obtained using the parameters of FIG. 9.

FIGS. 10a and 10b depict results obtained in a Monte Carlo simulation using the ring oscillator stage of FIG. 9 to form a 13 stage oscillator. In the simulation, local stage variations for device process parameters were introduced. A thousand point simulation was conducted using the process conditions corner TT.

In FIG. 10a, the NMOS results are shown. The vertical axis is the ring frequency, in Mhz, observed. The horizontal axis is the threshold voltage for the NMOS DUT transistors in volts. As the threshold voltage increases, the frequency decreases, and the reader should note the inverse linear relationship between oscillator frequency and Vthn. Similarly, FIG. 10b shows the threshold voltage and oscillator frequency data obtained for the PMOS DUT transistors in these simulations.

Figure 11:
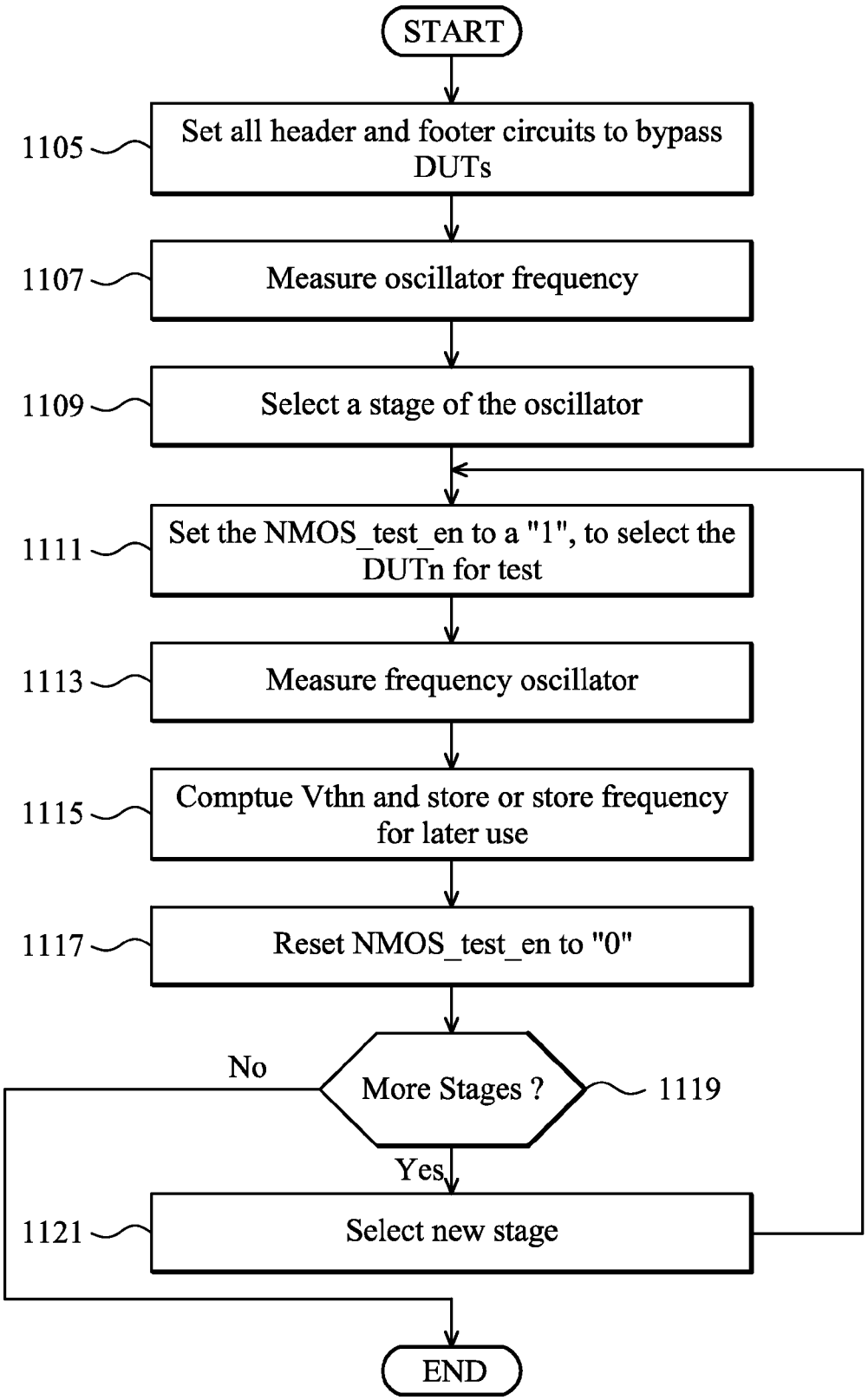
FIG. 11 is a flow diagram of a method embodiment for characterizing process variations in NMOS devices.

In FIG. 11, a method embodiment for obtaining the threshold voltage variations for, as an example, the NMOS devices in a circuit comprising the ring oscillator embodiments of the invention, is depicted as a flow diagram.

In step 1105, the method begins by configuring each stage in the ring oscillator, which can be any odd number of stages such as 5, 7, 9, 13, 27, etc. as examples, to bypass the test devices. In this configuration, the oscillator frequency is not impacted by any of the test devices.

In step 1107, a baseline or nominal frequency for the oscillator is obtained.

In step 1109, a first stage is selected for taking test measurements.

In step 1111, a loop of steps begins. The selected stage is configured using the NMOS_test_en signal for that stage to put the device under test DUTn for that stage in the oscillator circuit. Since the bypass gate for the NMOS devices under test is a PMOS transistor, this means setting the NMOS_test_en control signal for that stage to a '1' while maintaining all other NMOS_test_en signals as a '0'. Similarly the PMOS_test_en signals would be set to a '0' for every stage in the oscillator.

In step 1113, the frequency is measured with the test device of the selected stage in the circuit.

In step 1115, the threshold voltage is computed and stored. Alternatively, the frequency obtained may be stored for later statistical analysis.

In step 1117, the control signal NMOS_test_en for the selected stage is returned to '0'.

In step 1119, a conditional step is shown. If additional inverter stages that have not been tested exist, the Y branch is taken, and the process continues to step 1121. If there are no more inverter stages to test, the N branch is taken and the method ends.

In step 1121, a new inverter stage is selected and the method returns to step 1111, where it continues.

The example method embodiment of FIG. 11 is shown using the NMOS devices under test to illustrate the method. The method then is performed using the PMOS_test_en signals to select and measure the ring oscillator frequency with each of the PMOS devices under test in the circuit. For simplicity and to avoid unnecessary duplication, this process is not explicitly shown but the use of the term PMOS_test_en wherever the term "NMOS_test_en" appears, and the use of the term DUTp wherever the term "DUTn" appears in FIG. 11 provides the steps for the PMOS device threshold voltage measurements.

FIG. 12a provides, in a table, the results obtained for the frequency of the 13 stage oscillator example simulated using the stage embodiment shown in FIG. 9. FIG. 12a provides the results when no DUTs are in the circuit, with an average frequency obtained as 330.23 Mhz. The standard deviation STD was 1.16. The ratio of the standard deviation STD over the average is therefore 0.35%. FIG. 12b depicts the simulation results obtained when, for one of the stages, one NMOS DUT is placed in the circuit, with local threshold variations. The correlation coefficient observed between the NMOS threshold voltage variation and the frequency was −0.950. This is a very good correlation which indicates that the oscillator frequency is a very useful measurement of threshold variation for the NMOS devices. The oscillator operation frequency is notably lowered by the presence of the DUTn transistor. Note that the average oscillator frequency is now 172.43 Mhz, while the standard deviation was 15.54 (very much higher than before, due to the presence of the DUTn devices and the local threshold voltage variations).

Similarly, FIG. 12c depicts the simulation results obtained when one of the PMOS DUTs was introduced into the circuit, and the simulation included local threshold voltage variation in the DUTp devices. The correlation coefficient was observed as −0.946; again very high and very similar to the NMOS DUT case of FIG. 12b. This correlation is particularly significant as the prior approaches, including the transfer gates used in the related application, did not achieve correlation this high for the PMOS devices. Thus, the embodiments of the present invention provide a simple measurement (frequency of a ring oscillator) that is highly correlated to the threshold voltage variations of the PMOS and NMOS devices under test, and which provides the ability to make local observations of threshold voltage variations. The average frequency was higher than for the NMOS DUTs but still substantially less than for the ring oscillator without DUTs in the circuit, and the frequency STD was 17.89, with the STD/average 10.57%. So from the ring oscillator without any DUTs in the circuit, the STD/Average ratio increased from less than 1% to over 9%.

Although the embodiments of the invention, and exemplary illustrations thereof and their advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A circuit comprising:
a plurality of inverters arranged in a sequential loop; and
a plurality of test circuits, with each test circuit coupled between a device power supply and a respective power supply node to a respective one of the inverters, each test circuit comprising:
a first field effect transistor (FET) having a first channel coupled between the respective power supply and the device power supply and receiving an enable signal on a gate terminal of the first FET; and
a second FET having a second channel coupled in parallel to the first channel and having a gate terminal coupled to the respective power supply;
wherein when the first FET is disabled by the enable signal, the voltage at the device power supply node to the inverter is changed due to the threshold voltage of the second FET.

2. The circuit of claim 1, wherein each first FET in each test circuit is controlled by an independent control signal.

3. The circuit of claim 1, wherein there are at least as many inverters in the plurality of inverters as there are test circuits in the plurality of test circuits.

4. The circuit of claim 1, wherein the first FET comprises a P-type FET (PFET) and the second FET comprises an N-type FET (NFET).

5. The circuit of claim 1, wherein the first FET comprises an N-type FET (NFET) and the second FET comprises a P-type FET (PFET).

6. The circuit of claim 1, further comprising a logic gate having a first input coupled to an output of one of the inverters in the plurality of inverters and a second input coupled to an enable control signal, the logic gate selectively turning on or off the circuit.

7. The circuit of claim 6, wherein the logic gate is a logic AND gate.

8. The circuit of claim 1, wherein there is an odd number of inverters in the plurality of inverters.

9. An integrated circuit comprising:
integrated circuitry disposed on a substrate, the integrated circuitry configured to perform defined operations; and
at least one ring oscillator disposed on the substrate, the ring oscillator configured to produce a clock signal at a frequency dependent on a configuration of elements in the ring oscillator, the ring oscillator comprising:
a plurality of inverters serially arranged in a loop, each receiving a virtual positive voltage supply and a virtual ground voltage supply;
a plurality of header test circuits each coupled to one of the plurality of inverters, each comprising a bypass transistor receiving an enable signal on a gate terminal and having a channel coupled between a positive voltage supply and the respective virtual voltage supply coupled to the respective one of the plurality of inverters and each further comprising a header transistor under test having a channel coupled between the positive voltage supply and the respective virtual voltage supply coupled to the respective one of the plurality of inverters; and
a plurality of footer test circuits each coupled to one of the plurality of inverters, each comprising a bypass transistor receiving an enable signal on a gate terminal and having a channel coupled between a ground voltage supply and the respective virtual ground voltage supply of the respective one of the plurality of inverters, and each further comprising a footer transistor under test having a channel coupled between the ground voltage supply and the respective virtual ground voltage supply of the respective one of the plurality of inverters;
wherein the frequency of oscillation of the ring oscillator may be affected by one of a header transistor under test and a footer transistor under test, responsive to the respective bypass transistor being disabled by the corresponding one of the enable signals.

10. The integrated circuit of claim 9, wherein the header transistors under test each comprise an N-type FET (NFET) and the header bypass transistors each comprise a P-type FET (PFET).

11. The integrated circuit of claim 9, wherein the footer transistors under test each comprise a P-type (PFET) and the footer bypass transistors each comprise an N-type FET (NFET).

12. The integrated circuit of claim 9, wherein each of the header test circuits and each of the footer test circuits is independently controlled by a respective enable signal.

13. The integrated circuit of claim 9, wherein the frequency of the ring oscillator correlates to the threshold voltage of a selected one of a header transistor under test and a footer transistor under test.

14. The integrated circuit of claim 9, wherein there is a plurality of ring oscillators disposed on the substrate, and wherein the ring oscillators are distributed over the surface of the substrate.

* * * * *